(12) United States Patent
Sakata et al.

(10) Patent No.: US 12,213,381 B2
(45) Date of Patent: Jan. 28, 2025

(54) METHOD FOR MANUFACTURING VIBRATION ELEMENT

(71) Applicant: Seiko Epson Corporation, Tokyo (JP)

(72) Inventors: Hiyori Sakata, Minowa (JP); Takuro Kobayashi, Minowa (JP); Ryuta Nishizawa, Nagano (JP); Keiichi Yamaguchi, Ina (JP); Shigeru Shiraishi, Ina (JP)

(73) Assignee: SEIKO EPSON CORPORATION (JP)

( * ) Notice: Subject to any disclaimer, the term of this patent is extended or adjusted under 35 U.S.C. 154(b) by 436 days.

(21) Appl. No.: 17/587,012

(22) Filed: Jan. 28, 2022

(65) Prior Publication Data

US 2022/0246835 A1 Aug. 4, 2022

(30) Foreign Application Priority Data

Jan. 29, 2021 (JP) ................................. 2021-012856
Aug. 26, 2021 (JP) ................................. 2021-137805

(51) Int. Cl.
  *H10N 30/08* (2023.01)
  *H03H 9/19* (2006.01)
  *H03H 9/215* (2006.01)
  *H10N 30/082* (2023.01)

(52) U.S. Cl.
  CPC ............ *H10N 30/082* (2023.02); *H03H 9/19* (2013.01); *H03H 9/215* (2013.01)

(58) Field of Classification Search
  CPC .. H10N 30/082; H10N 30/85; G01C 19/5621; H03H 9/19; H03H 9/215; H03H 9/2473; H03H 2003/026; H03H 3/02; H03H 9/0519

See application file for complete search history.

(56) References Cited

U.S. PATENT DOCUMENTS

| | | | | |
|---|---|---|---|---|
| 4,384,232 A * | 5/1983 | Debely | ................ | H03H 9/215 310/368 |
| 6,791,243 B2 * | 9/2004 | Kawashima | ......... | H03H 9/0547 310/319 |
| 8,156,621 B2 * | 4/2012 | Iwai | ........................ | H03H 9/21 29/25.35 |

FOREIGN PATENT DOCUMENTS

JP  2007-013382 A  1/2007

* cited by examiner

*Primary Examiner* — Donghai D Nguyen
(74) *Attorney, Agent, or Firm* — Harness, Dickey & Pierce, P.L.C.

(57) ABSTRACT

A method for manufacturing a vibration element that includes a base portion, a first vibration arm and a second vibration arm that extend from the base portion along a first direction and are arranged along a second direction intersecting the first direction, and bottomed grooves on both main surfaces of the first vibration arm and both main surfaces of the second vibration arm includes: a preparing step of preparing a crystal substrate; a protective film forming step of forming a protective film on the crystal substrate except for groove regions that are regions in which the grooves are formed; and a dry etching step of dry etching the crystal substrate through the protective film to form the grooves. The grooves provided in at least one of the first vibration arm and the second vibration arm include a first groove and a second groove arranged along the second direction.

3 Claims, 19 Drawing Sheets

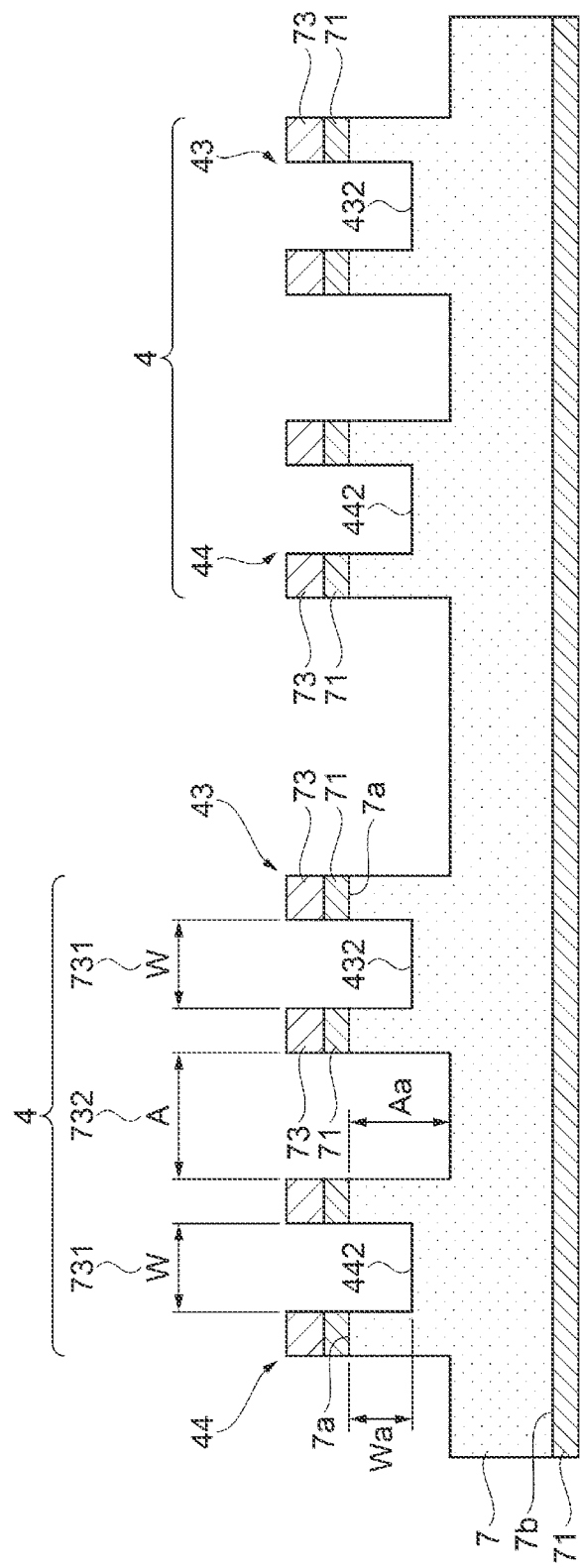

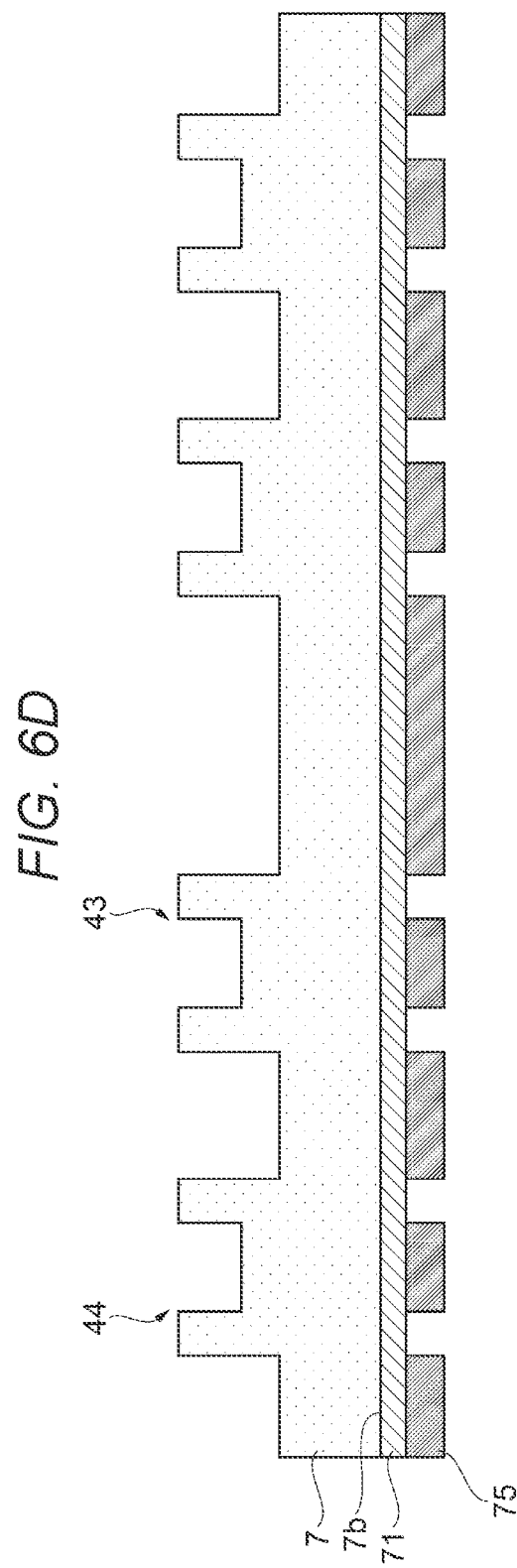

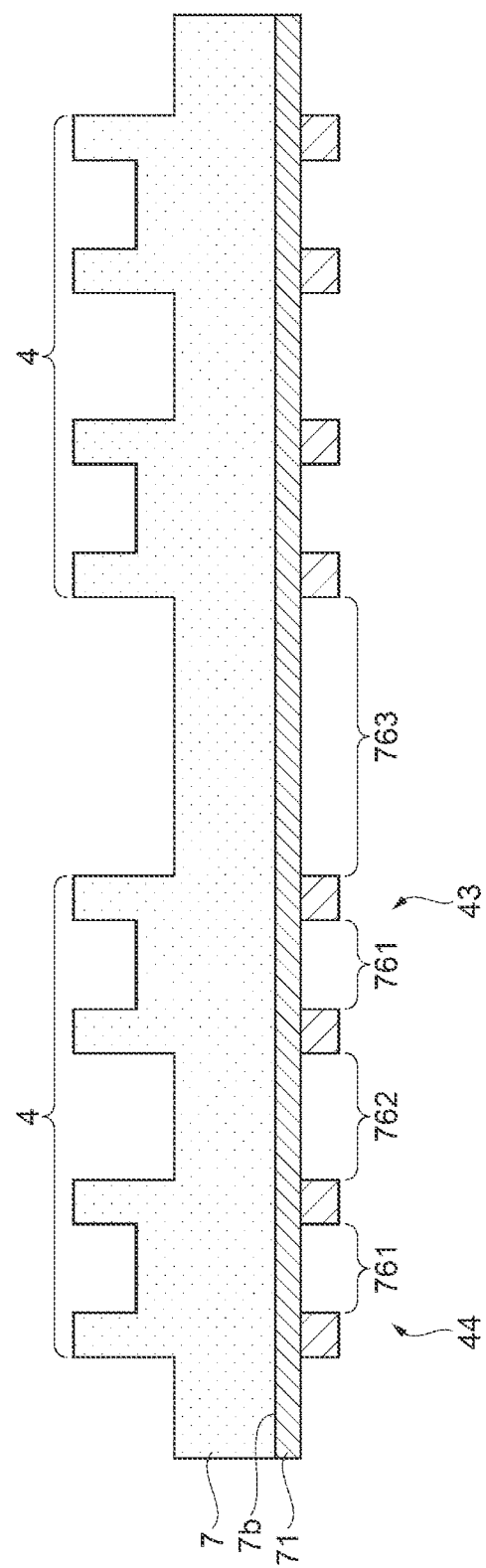

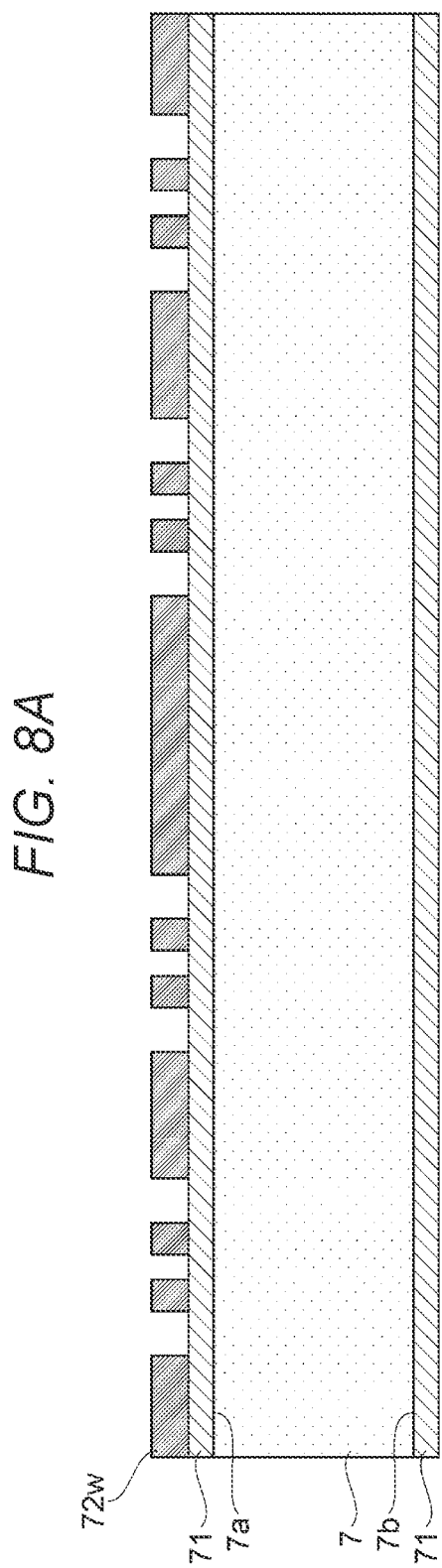

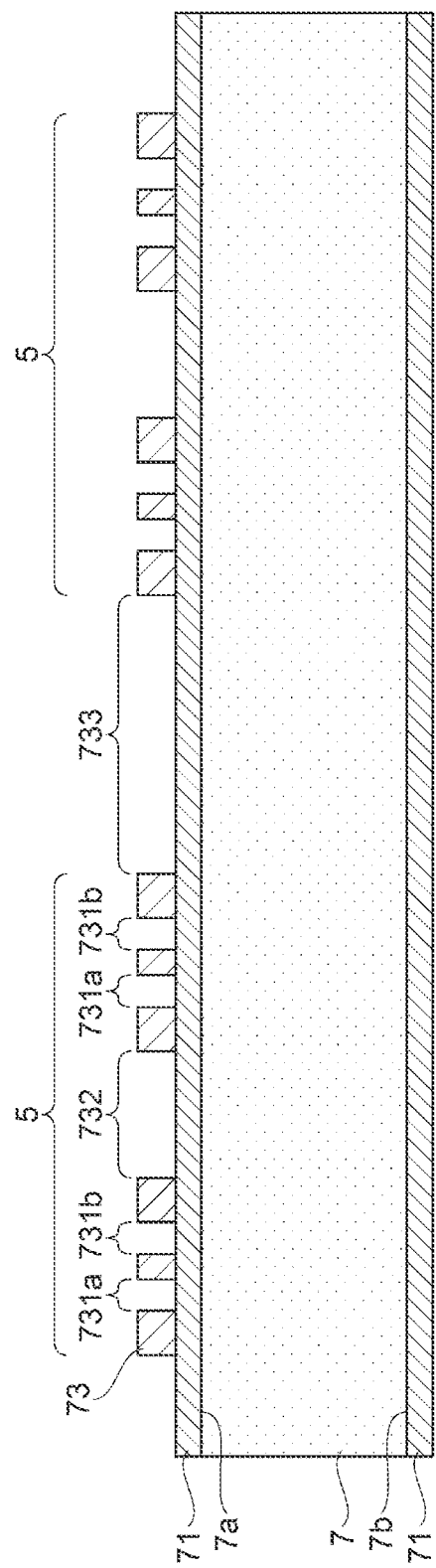

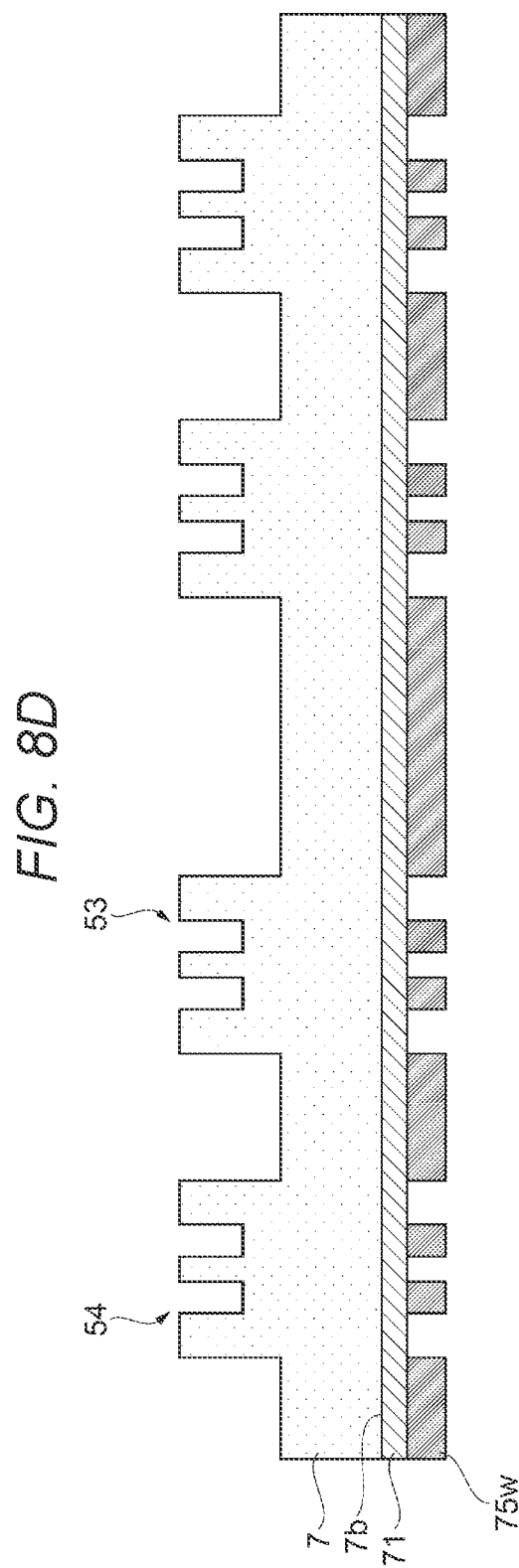

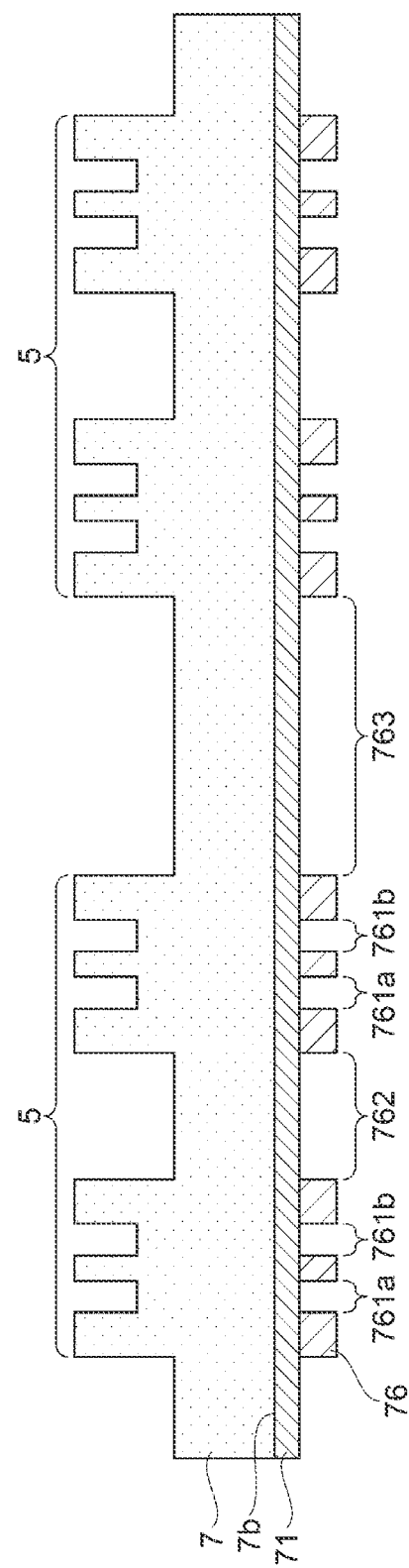

METHOD FOR MANUFACTURING VIBRATION ELEMENT

The present application is based on, and claims priority from JP Application Serial Number 2021-012856, filed Jan. 29, 2021, and JP Application Serial Number 2021-137805, filed Aug. 26, 2021, the disclosures of which are hereby incorporated by reference herein in its entirety.

BACKGROUND

1. Technical Field

The present disclosure relates to a method for manufacturing a vibration element.

2. Related Art

For example, JP-A-2007-13382 describes a method for forming, by dry etching, a tuning fork vibrator having a bottomed groove. Specifically, JP-A-2007-13382 discloses that an outer shape and a groove of the tuning fork vibrator are collectively formed by processing an etching depth between a pair of vibration arms to be deeper and an etching depth of the groove to be shallower by utilizing a micro-loading effect in dry etching and setting a groove width to be narrower than a distance between the vibration arms.

However, as disclosed in JP-A-2007-13382, when the groove is formed utilizing the micro-loading effect, the groove depth to be etched and a dimension of a groove width correlate with each other, and therefore a problem is that it is difficult to obtain a desired groove depth when the groove width is set to a predetermined dimension.

SUMMARY

A method for manufacturing a vibration element according to the present application is a method for manufacturing a vibration element that includes a base portion, a first vibration arm and a second vibration arm that extend from the base portion along a first direction and are arranged along a second direction intersecting the first direction, and bottomed grooves on both main surfaces of the first vibration arm and both main surfaces of the second vibration arm. The method includes: a preparing step of preparing a crystal substrate; a protective film forming step of forming a protective film on the crystal substrate except for groove regions which are regions in which the grooves are formed; and a dry etching step of dry etching the crystal substrate through the protective film to form the grooves. The grooves provided in at least one of the first vibration arm and the second vibration arm include a first groove and a second groove arranged along the second direction.

BRIEF DESCRIPTION OF THE DRAWINGS

FIG. 6C is a diagram illustrating an aspect of the manufacturing step.
FIG. 6D is a diagram illustrating an aspect of the manufacturing step.
FIG. 6E is a diagram illustrating an aspect of the manufacturing step.
FIG. 8A is a diagram illustrating an aspect of a manufacturing step.
FIG. 8B is a diagram illustrating an aspect of the manufacturing step.
FIG. 8D is a diagram illustrating an aspect of the manufacturing step.
FIG. 8E is a diagram illustrating an aspect of the manufacturing step.

DESCRIPTION OF EXEMPLARY EMBODIMENTS

First Embodiment

Configuration of Vibration Device

Figure 1:
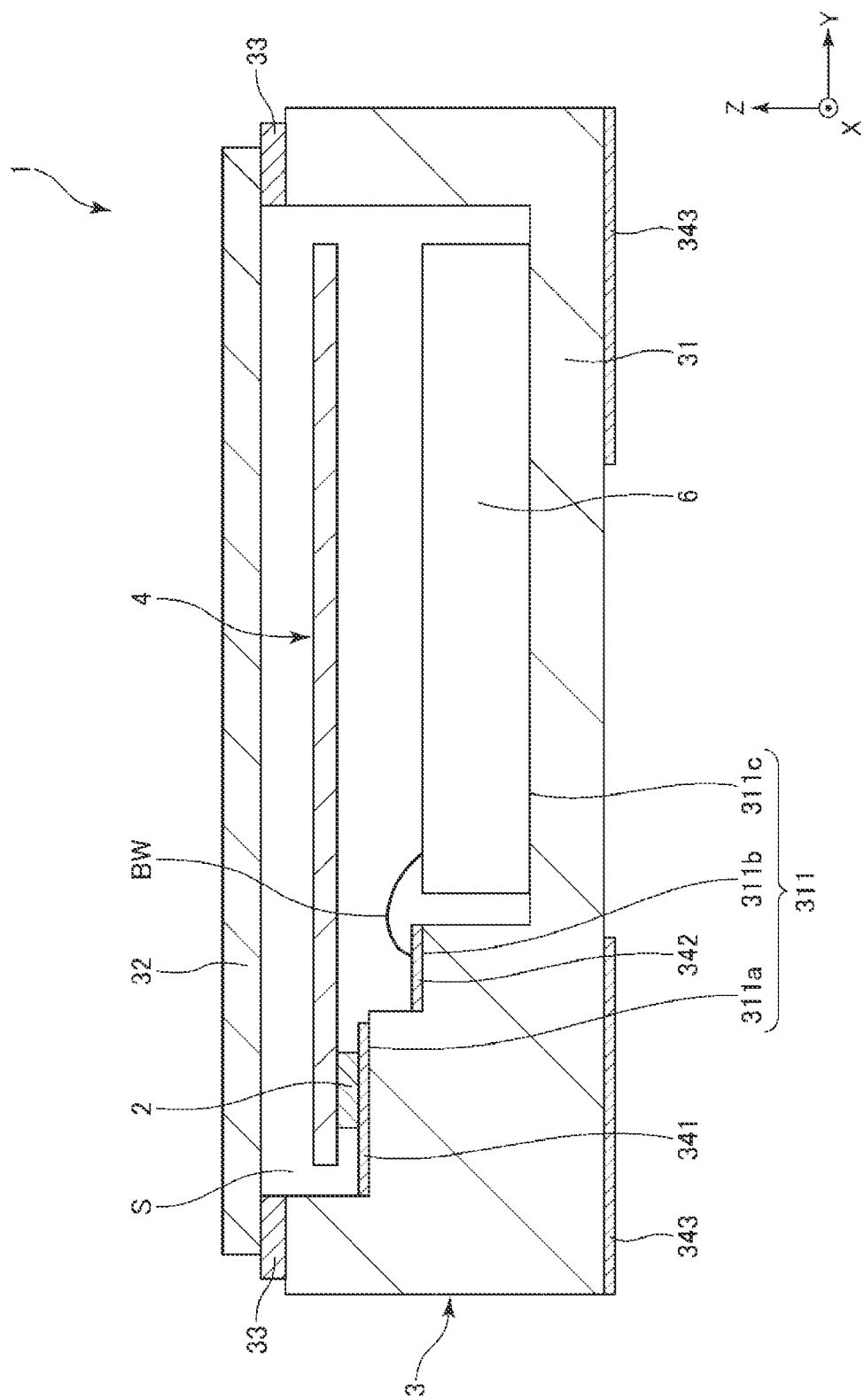
FIG. 1 is a side cross-sectional view of a vibration device according to a first embodiment.

FIG. 1 is a cross-sectional view illustrating a configuration of a vibration device according to the present embodiment.

The vibration device 1 includes a package 3, vibration elements 4 accommodated in the package 3, a circuit element 6, and the like. In a preferable example, the vibration element 4 is a tuning fork type crystal vibration element, and the vibration device 1 is a crystal oscillator including an oscillation circuit.

As shown in FIG. 1, the package 3 includes a base 31 that has a recess 311 opened on an upper surface and a plate-shaped lid 32 that is bonded to an upper surface of the base 31 via bonding members 33 so as to close the opening of the recess 311. An internal space S is formed inside the package 3 by the recess 311, and the vibration element 4 and the circuit element 6 are accommodated in the internal space S.

For example, the base 31 can be made of ceramics such as alumina, and the lid 32 can be made of a metal material such as kovar. However, constituent materials of the base 31 and the lid 32 are not particularly limited. For example, the lid 32 can be made of a glass material having light transmitting properties.

In addition, the internal space S is airtight and is in a reduced pressure state, preferably in a state closer to a vacuum. Accordingly, viscous resistance is reduced, and vibration characteristics of the vibration element 4 are improved. However, an atmosphere of the internal space S is not particularly limited, and may be, for example, an atmosphere in which an inert gas such as nitrogen or Ar is sealed, or may be an atmospheric pressure state or a pressurized state instead of the reduced pressure state.

The recess 311 includes a recess 311*a* that is opened on the upper surface of the base 31, a recess 311*b* that is opened on a bottom surface of the recess 311a and has an opening width smaller than that of the recess 311a, and a recess 311c that is opened on a bottom surface of the recess 311b and has an opening width smaller than that of the recess 311b. The vibration element 4 is bonded to the bottom surface of the recess 311a via conductive bonding members 2, and the circuit element 6 is bonded to the bottom surface of the recess 311c.

A plurality of internal terminals 341 are disposed on the bottom surface of the recess 311a, and a plurality of internal terminals 342 are disposed on the bottom surface of the recess 311b, and external terminals 343 are disposed on the bottom surface of the base 31. A part of the plurality of internal terminals 342 are electrically coupled to the internal terminals 341 via an internal wiring (not shown) that is formed in the base 31, and remaining internal terminals 342 are electrically coupled to the external terminals 343 via the internal wiring. Each of the internal terminals 342 is electrically coupled to the circuit element 6 via a bonding wire BW.

Configuration of Vibration Element

Figure 2:
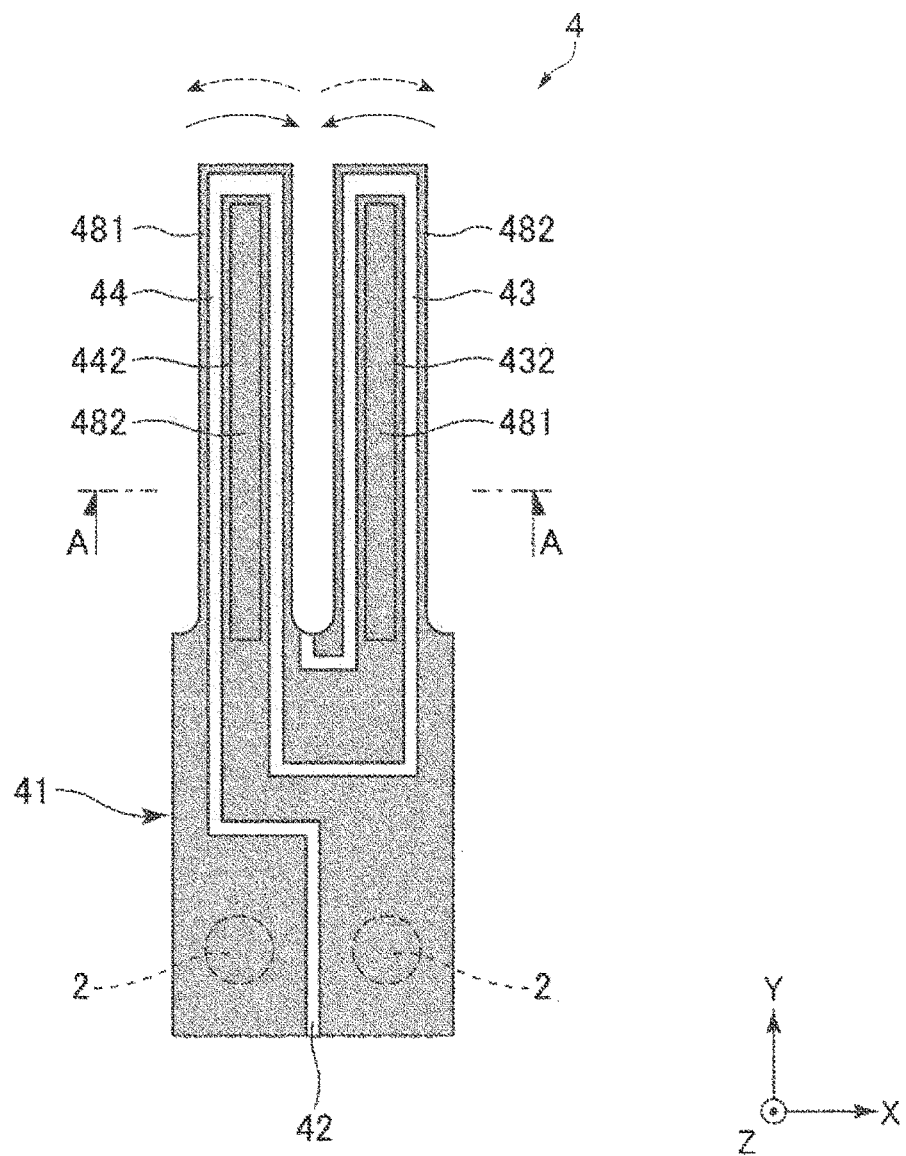
FIG. 2 is a plan view of a vibration element.

The vibration element 4 illustrated in FIG. 2 is a tuning fork type vibration element in the first embodiment, but the shape of the vibration element 4 is not limited as long as the vibration element 4 has a groove on a part thereof.

The vibration element 4 includes a vibration body 41. The vibration body 41 includes a base portion 42, and a pair of vibration arms 43 and 44 extending from the base portion 42 in a Y-axis plus direction. In other words, the vibration element 4 includes the base portion 42, the vibration arm 43 as a first vibration arm, and the vibration arm 44 as a second vibration arm. The vibration arm 43 and the vibration arm 44 extend from the base portion 42 along the Y-axis plus direction as a first direction and are arranged along an X-axis minus direction as a second direction intersecting the first direction. A bottomed groove 432 is provided in front and back surfaces as both main surfaces of the vibration arm 43. Similarly, a bottomed groove 442 is provided in front and back surfaces of the vibration arm 44. The base portion 42 is fixed to the base 31 via a pair of bonding members 2.

A constituent material of the vibration body 41 is not particularly limited, and for example, various piezoelectric materials such as lithium niobate ($LiNbO_3$), lithium tantalate ($LiTaO_3$), lead zirconate titanate (PZT), lithium tetraborate ($Li_2B_4O_7$), langasite ($La_3Ga_5SiO_{14}$), potassium niobate ($KNbO_3$), gallium phosphate ($GaPO_4$), gallium arsenide (GaAs), aluminum nitride (AlN), zinc oxide (ZnO, $Zn_2O_3$), barium titanate ($BaTiO_3$), lead titanate ($PbTiO_3$), sodium potassium niobate ((K, Na) $NbO_3$), bismuth ferrite ($BiFeO_3$), sodium niobate ($NaNbO_3$), bismuth titanate ($Bi_4Ti_3O_{12}$), bismuth sodium titanate ($Na_{0.5}Bi_{0.5}TiO_3$), or the like may be used. For example, a material other than the piezoelectric materials such as a silicon substrate may be used.

Figure 3:
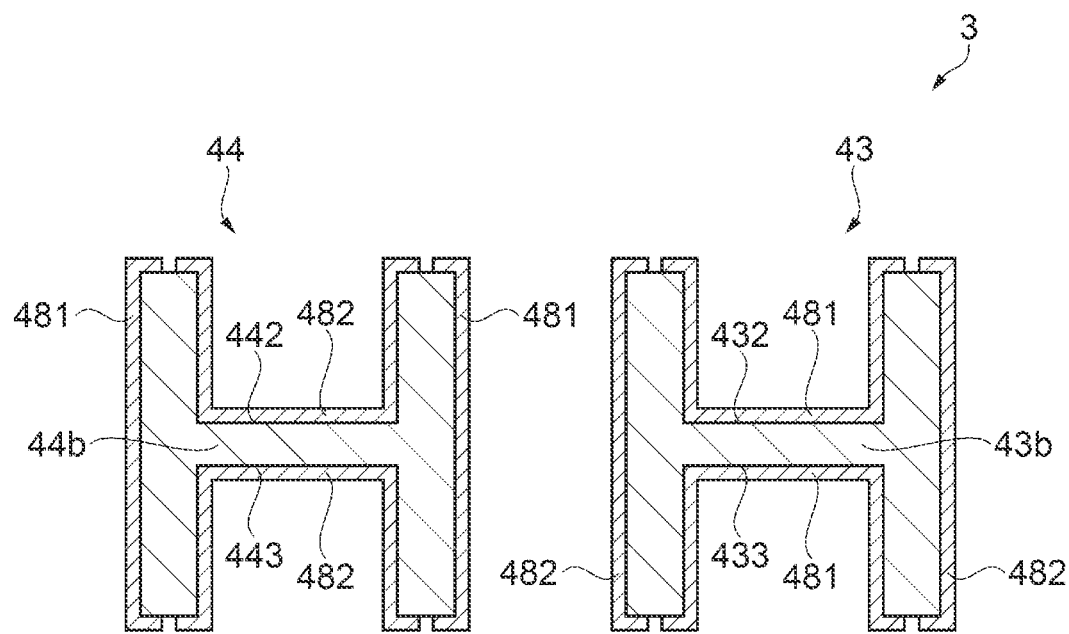
FIG. 3 is a cross-sectional view of a vibration arm taken along a line A-A.

In addition, as shown in FIG. 3, the vibration arm includes a groove 432 opened on an upper surface and a groove 433 opened on a lower surface. A bottom of the groove 432 is a bottom portion 43b. Similarly, the vibration arm 44 includes the groove 442 opened on an upper surface and a groove 443 opened on a lower surface. A bottom of the groove 442 is a bottom portion 44b. Therefore, the vibration arms 43 and 44 each have a substantially H-shaped cross-sectional shape.

As shown in FIGS. 2 and 3, signal electrodes 481 and ground electrodes 482 are disposed on the vibration body 41 as electrodes. As shown in FIG. 3, the signal electrodes 481 are disposed on the upper surface and the lower surface of the vibration arm 43 and both side surfaces of the vibration arm 44. Meanwhile, the ground electrodes 482 are disposed on both side surfaces of the vibration arm 43 and the upper surface and the lower surface of the vibration arm 44. The signal electrodes 481 are electrically coupled to the internal terminals 341 via one bonding member 2, and the ground electrodes 482 are electrically coupled to other internal terminals 341 via the other bonding member 2. Accordingly, the vibration element 4 and the circuit element 6 are electrically coupled to each other. When the circuit element 6 applies a drive signal to the signal electrodes 481, the vibration arms 43 and 44 repeatedly approach and separate from each other to perform flexural vibration as indicated by arrows in FIG. 2.

For convenience of illustration, each of the drawings illustrates an X axis, a Y axis, and a Z axis that are three axes orthogonal to each other. Further, an arrow side of each axis is also referred to as a plus side, and an opposite side is also referred to as a minus side. The plus side in the Z-axis direction is also referred to as "upper", and the minus side in the Z-axis direction is also referred to as "lower". A plan view from the Z-axis direction is also simply referred to as a "plan view". The X-axis, the Y-axis, and the Z-axis correspond to crystal axes of a quartz crystal, as will be described later.

The vibration body 41 is a tuning fork type crystal vibration element. The vibration body 41 is formed of a Z-cut crystal plate, has a spread on an XY plane defined by an X axis (electric axis) and a Y axis (machine axis), which are crystal axes of the quartz crystal, and has a thickness in a Z axis direction (optical axis).

In the vibration element 4, a weight that is used for adjusting resonance frequency or adjusting vibration balance of the vibration arms 43 and 44 may be disposed at a tip portion of each of the vibration arms 43 and 44.

Method for Manufacturing Vibration Element-1

Figure 4:
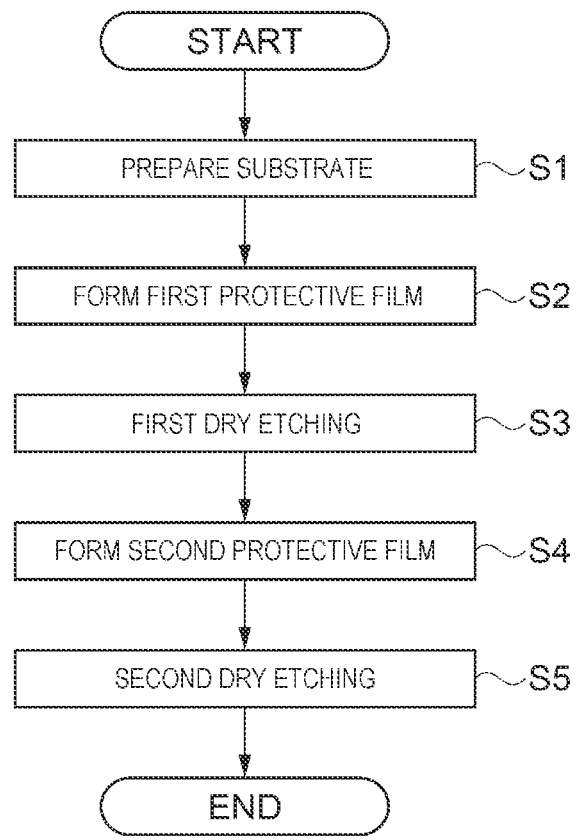
FIG. 4 is a flowchart illustrating a flow of a method for manufacturing a vibration element.
Figure 5:
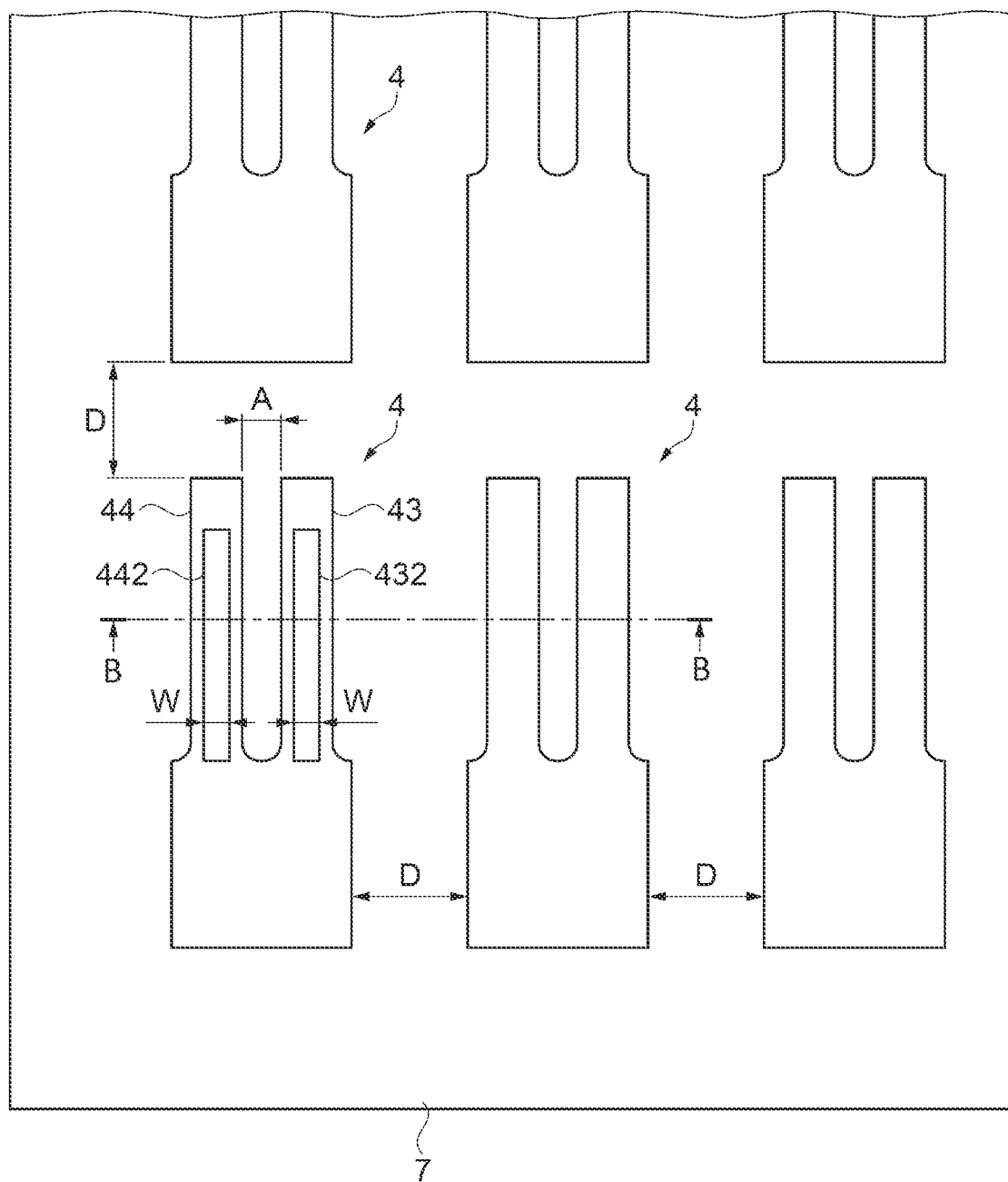
FIG. 5 is a plan view of a crystal substrate to which a plurality of vibration elements are attached.

FIG. 4 is a flowchart illustrating a method for manufacturing a vibration element. FIG. 5 is a plan view of the crystal substrate. FIGS. 6A to 6F are process diagrams illustrating aspects of a product in manufacturing steps, and are side cross-sectional views taken along a line B-B of FIG. 5.

Here, a method for manufacturing the vibration element 4 will be described mainly with reference to FIG. 4 and with reference to FIGS. 3, 5, and 6A to 6F as appropriate.

First, in an actual manufacturing step, manufacture is performed in a state in which a plurality of vibration elements 4 are attached to the crystal substrate 7 as shown in FIG. 5. The plurality of vibration elements 4 are arranged vertically and horizontally in a matrix along an X axis and a Y axis of the crystal substrate 7. In each of the following steps, contents of each step will be described using a transition of aspects of a cross section taken along a cross-sectional line B-B of two vibration elements 4 that are adjacent to each other in a direction along the X axis.

A width of the groove 432 of the vibration arm 43 is defined as a width W. A width of the groove 442 of the vibration arm 44 paired with the vibration arm 43 is also set to the same width W. A distance between the two adjacent vibration arms 43 and 44 is defined as a width A. The width A corresponds to an inter-arm region. A thickness of the crystal substrate 7 is defined as a thickness t.

As shown in FIG. 5, an arrangement of the vibration elements 4 on the crystal substrate 7 is such that the plurality of vibration elements 4 are aligned and arranged in parallel with respect to the X-axis and the Y-axis, respectively.

Figure 6A:
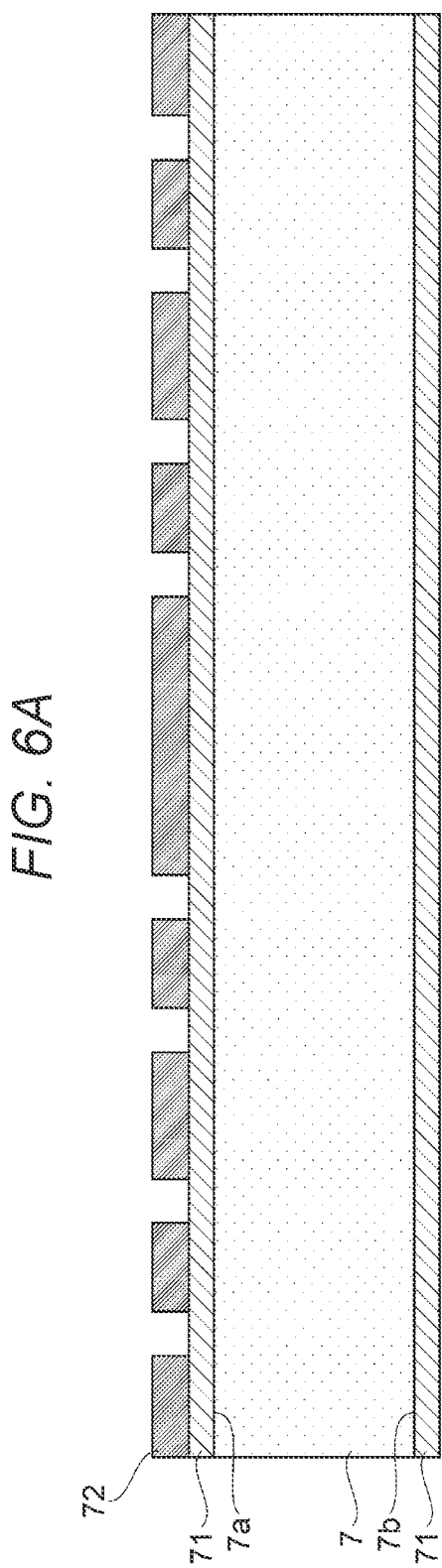
FIG. 6A is a diagram illustrating an aspect of a manufacturing step.

In step S1, the crystal substrate 7 forming the vibration element 4 is prepared. Specifically, as shown in FIG. 6A, metal films 71 are sputtered on both surfaces of the crystal substrate 7 that is polished so as to make front and back surfaces uniform, and a resist film 72 is formed only on a surface to be subjected to a first dry etching. Specifically, the resist film 72 is formed on a front surface 7a side of the crystal substrate 7. Subsequently, the resist film 72 at a metal mask forming position is removed by exposure and development. FIG. 6A shows a state in which the resist film 72 is formed, exposed, and developed. The front surface 7a of the crystal substrate 7 corresponds to one main surface, and a back surface 7b corresponds to the other main surface.

Figure 6B:
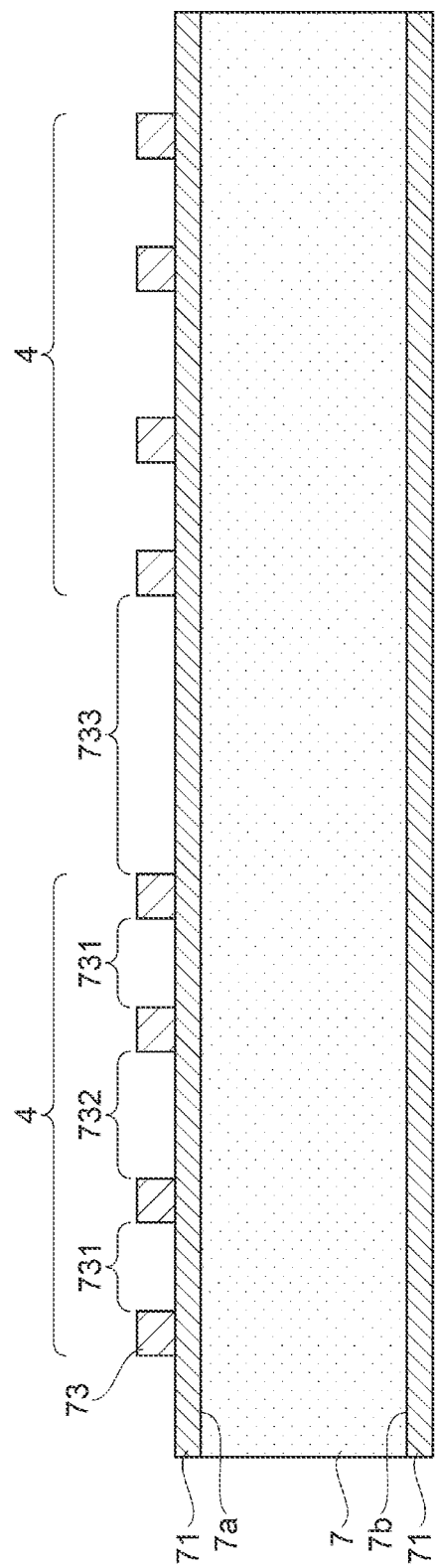
FIG. 6B is a diagram illustrating an aspect of the manufacturing step.

In step S2, a first protective film is formed on the metal film 71 on the front surface 7a of the crystal substrate 7. Specifically, a metal mask 73 is formed as the first protective film on a portion where the resist film 72 is removed in step S1. In a preferable example, a nickel mask is used as the metal mask 73. Thereafter, as shown in FIG. 6B, the metal mask 73 in which a portion to be removed of the crystal substrate 7 is opened is formed by removing the resist film 72. Openings 731 are groove regions, and indicate portions where the grooves 432 and 442 are formed. Similarly, an opening 732 indicates a portion corresponding to a gap between the vibration arms 43 and 44, and an opening 733 indicates a portion that is a gap between the adjacent vibration elements 4. That is, the metal mask 73 as the protective film is formed except for the openings 731 that are the groove regions and the opening 732 that is the inter-arm region being a region between a first region in which the vibration arm 44 is formed and a second region in which the vibration arm 43 is formed.

Subsequently, in step S3, first dry etching is performed on the front surface 7a of the crystal substrate 7. Dry etching is performed by using a generally adopted oxide film dry etcher in a reactive ion etching (RIE) device using a reactive gas such as trifluoromethane ($CHF_3$).

Here, as shown in FIG. 6C, the opening 731 is etched from the front surface 7a of the crystal substrate 7 to a depth Wa to form the groove 442. Meanwhile, the opening 732 is etched from the front surface 7a to a depth Aa that is larger than the depth Wa to form a gap of the width A between the vibration arms 43 and 44. That is, the depth Wa <the depth Aa. This is because an etching rate difference occurs due to the micro-loading effect since the width A of the opening 732 is larger than the width W of the opening 731, in other words, the width W<the width A.

Therefore, even if the opening 731 and the opening 732 are etched in parallel under same conditions, the depth Wa of the groove 442 can be processed smaller than the depth Aa of the gap between the vibration arms 43 and 44. The same applies to the groove 432. The depth Wa and the depth Aa are defined as depths of the deepest portions in the regions of the width W and the width A, respectively.

As shown in FIG. 5, the adjacent vibration elements 4 are arranged at a distance D. The distance D is larger than the width A between the vibration arms 43 and 44. More specifically, both the distance D in the direction along the X axis and a distance D in a direction along the Y axis are set to be larger than at least the distance A between the vibration arms 43 and 44. This is to prevent an etching residue from being generated between the vibration elements 4 when the vibration element 4 is separately formed from the crystal substrate 7 by dry etching.

As described above, the grooves 442 and 432 and a vibration arm outer shape including the vibration arms 43 and 44 are simultaneously formed in a first dry etching step. Further, the "simultaneously formed" refers to collectively forming two in one step.

The metal mask 73 and the metal film 71 are removed after the completion of the first dry etching , and the back surface of the crystal substrate 7 is processed.

In step S4, a second protective film is formed on the back surface 7b of the crystal substrate 7. Specifically, as shown in FIG. 6D, on a surface of the metal film 71 formed on the back surface 7b, a resist film 75 is formed only on a surface to be subjected to a second dry etching, as in step S2. Subsequently, the resist film 75 at a metal mask forming position is removed by exposure and development. In an actual step, the crystal substrate 7 is reversed and is processed in a state in which the back surface 7b is turned upside, but in order to make the step transition easier to understand, the back surface 7b is shown on a back side. The same applies to FIGS. 6E and 6F.

Subsequently, a metal mask 76 is formed as a second protective film in a portion where the resist film 75 is removed in step S4. The metal mask 76 is a metal mask similar to the metal mask 73. Then, as shown in FIG. 6E, the metal mask 76 in which a portion to be removed of the crystal substrate 7 is opened is formed by removing the resist film 75. Openings 761 are portions where the grooves 433 and 443 are formed. Similarly, an opening 762 indicates a portion corresponding to a gap between the vibration arms 43 and 44, and an opening 763 indicates a portion which is a gap between the adjacent vibration elements 4.

Figure 6F:
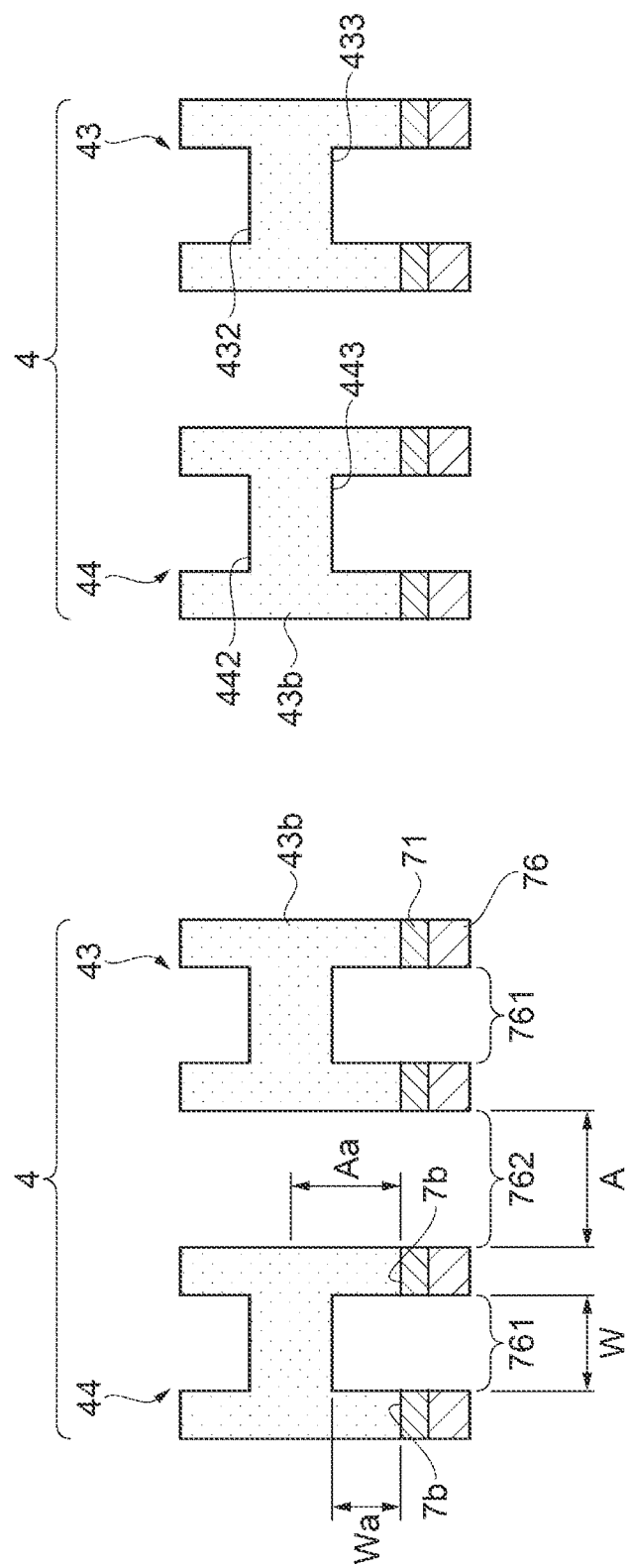
FIG. 6F is a diagram illustrating an aspect of the manufacturing step.

Subsequently, in step S5, second dry etching is performed on the back surface 7b of the crystal substrate 7. As shown in FIG. 6F, a dry etching depth from the back surface 7b depends on an opening width as in the case of the front surface 7a. The openings 761 are etched from the back surface 7b to the depth Wa to form the grooves 433 and 443. Meanwhile, the opening 762 is etched to the depth Aa that is smaller than the depth Wa to form a gap between the vibration arms 43 and 44.

The opening 762 is etched to a thickness t/2 or more, which is half the thickness of the crystal substrate 7, by being etched to the depth Aa, and thus the opening 762 penetrates through the crystal substrate 7 and an outer shape is cut out. Meanwhile, the opening 761 is etched to the depth Wa, but the bottom portion 43b of the groove 432 remains, and thus the vibration arm 43 having the groove 432 is formed. The same applies to the vibration arm 44.

As described above, also in the second dry etching step, the grooves 433 and 443 and the vibration arm outer shape including the vibration arms 43 and 44 are simultaneously formed similarly to the first dry etching step. The first dry etching step in step S3 and the second dry etching step in step S5 are collectively referred to as a dry etching step. In other words, the dry etching step includes the first dry etching step and the second dry etching step.

In this way, the H-shaped vibration arms 43 and 44 are formed as shown in FIG. 3. The vibration arm 43 has the grooves 432 and 433, and the vibration arm 44 has the grooves 442 and 443.

Thereafter, the metal mask 76 and the like on the surface of the vibration element 4 are removed to form the electrodes as described above, and the process steps of the vibration element 4 are completed.

Incidentally, as an example, in the manufacturing steps of the vibration element 4 described above, an example is shown in which the metal mask is formed by a photolithography method and dry etching is performed using the metal mask, but a method of directly using the resist film as a mask for dry etching can also be adopted. In addition, in the first embodiment, the step of forming the protective film on the front surface and the step of forming the protective film on the back surface are separately performed, but the dry etching on the front surface and the dry etching on the back surface may be performed after forming the protective films on the front surface and the back surface at the same time.

As described above, the following effects can be obtained according to the vibration element 4 of the present embodiment and the manufacturing method thereof.

There is provided the method for manufacturing the vibration element 4 that includes the base portion 42, the vibration arm 43 and the vibration arm 44 that extend from the base portion 42 along an extending direction of the Y-axis and are arranged along an extending direction of the X-axis, the bottomed grooves 432 and 433 on both main surfaces of the vibration arm 43, and the grooves 442 and 443 on both main surfaces of the vibration arm 44. The method includes the preparing step of preparing the crystal substrate 7; the protective film forming step of forming a protective film on the crystal substrate 7 except for groove regions which are regions in which the grooves are formed; and the dry etching step of dry etching the crystal substrate 7 through the protective film to form the grooves.

Accordingly, the groove width W of the vibration arms 43 and 44 corresponds to the groove depth at which the dry etching is stopped, and thus a stable groove depth can be obtained even when etching time varies, and the vibration element 4 having little characteristic variation can be obtained. Therefore, adjustment in a frequency adjustment step may be slight, and thus it is possible to suppress the amount of gold added to the vibration arm for frequency adjustment.

Further, by setting the width W of the groove where etching stops at a predetermined groove depth Wa and the width A of the gap between the adjacent vibration arms 43 and 44 that penetrate in a thickness direction by etching to predetermined dimensions, the bottomed grooves 432, 433, 442, 443 and the outer shape of the vibration arms 43, 44 can be simultaneously processed by dry etching, so that the manufacturing steps can be simplified and the vibration characteristics can be improved.

The dry etching step includes a first dry etching step of forming the grooves 432 and 442 on the front surface 7a of the crystal substrate 7, and a second dry etching step of forming the grooves 433 and 443 on the back surface 7b of the crystal substrate.

Accordingly, it is possible to form the vibration element 4 having the grooves on both the front and back surfaces of the crystal substrate 7.

In the first protective film forming step, the metal mask 73 is formed except for the opening 731 that is the groove region and the opening 732 that is the inter-arm region being the region between the first region where the vibration arm 44 is formed and the second region where the vibration arm 43 is formed. In the first dry etching step, the grooves 432 and 442 and the vibration arm outer shape including the vibration arms 43 and 44 are simultaneously formed, and the inter-arm region can be reliably penetrated when a width in a direction along the second direction of the inter-arm region is set to the predetermined width A.

In addition, the formation of the vibration element 4 is not affected by anisotropy of crystal orientation of the crystal substrate 7 by adopting the dry etching, and thus symmetry of the shape of the pair of vibration arms 43 and 44 can be realized, and the vibration element 4 having a highly accurate resonance frequency can be provided.

In addition, the vibration element 4 of the present embodiment is manufactured by the manufacturing method described above, and includes the base portion 42, the vibration arm 43 and the vibration arm 44. that extend from the base portion 42 and have the grooves 432, 433 and the grooves 442, 443 respectively on the front and back surfaces. Therefore, it is possible to realize the vibration element 4 which has a highly accurate resonance frequency and can be reduced in size and enhanced in frequency at low cost.

Second Embodiment

Configuration of Vibration Element of Different Aspect

Figure 7:
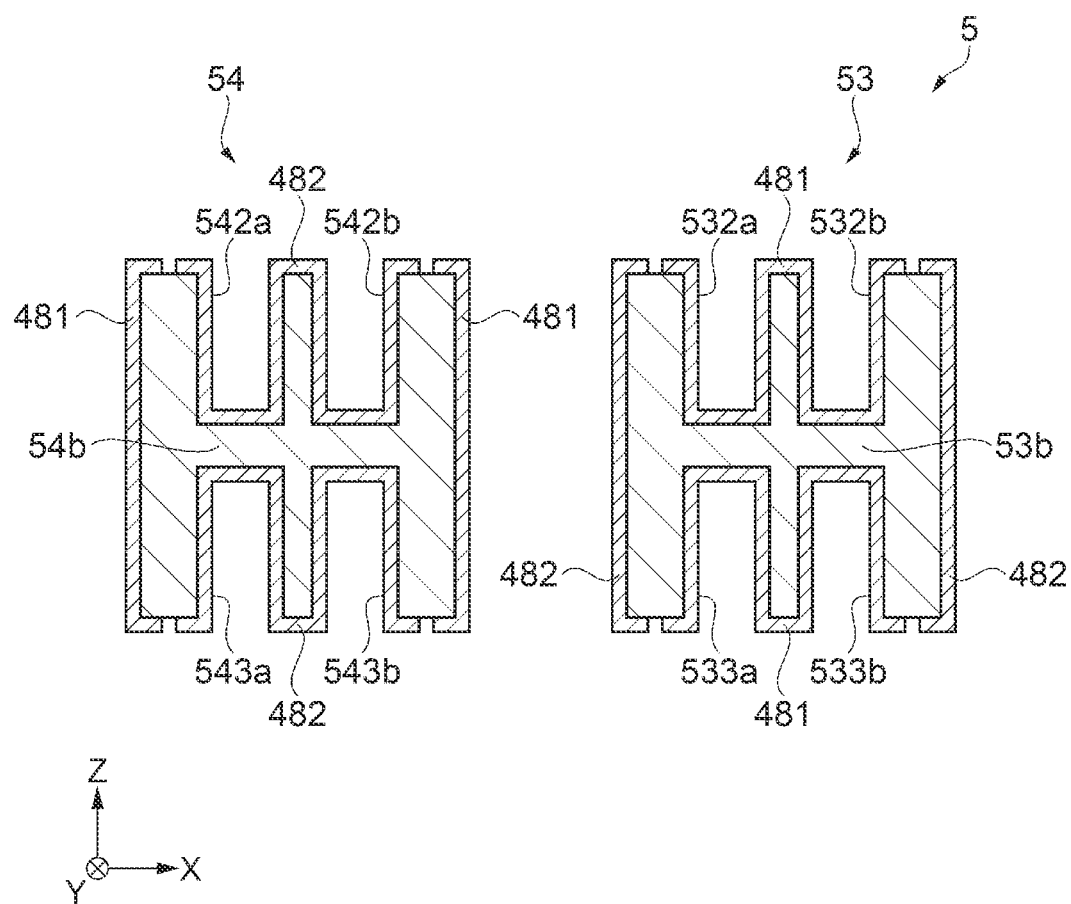
FIG. 7 is a cross-sectional view of vibration arms according to a second embodiment.

FIG. 7 is a cross-sectional view of the vibration element of the present embodiment and corresponds to FIG. 3.

In the first embodiment, the vibration arm 43 has a configuration in which the groove 432 is provided on the front surface and the groove 433 is provided on the back surface, but a plurality of grooves may be provided. A vibration element 5 of the present embodiment is different from the vibration element in the first embodiment in that two grooves 532a and 532b are provided on a front surface of a vibration arm 53 and two grooves 533a and 533b are provided on a back surface thereof. The same applies to a vibration arm 54. The vibration element 5 is the same as the vibration element 4 in the first embodiment except for these points. Hereinafter, the same components as those in the first embodiment will be denoted by the same reference numerals, and redundant description will be omitted.

As shown in FIG. 7, in the vibration element 5 of the present embodiment, the two grooves 532a and 532b are provided on the front surface of the vibration arm 53, and the two grooves 533a and 533b are provided on the back surface of the vibration arm 53. A bottom of the grooves 532a and 532b is a bottom portion 53b.

The same applies to the vibration arm 54 paired with the vibration arm 53. Two grooves 542a and 542b are provided on a front surface of the vibration arm 54, and two grooves 543a and 543b are provided on a back surface of the vibration arm 54. A bottom of the grooves 542a and 542b is a bottom portion 54b. The configuration of the vibration element 5 is the same as that of the vibration element 4 in the first embodiment except for these points.

Method for Manufacturing Vibration Element-2

FIGS. 8A to 8F are process diagrams illustrating aspects of a product in manufacturing steps and correspond to FIGS. 6A to 6F.

The method for manufacturing the vibration element 5 is basically the same as the method for manufacturing the vibration element 4 of FIG. 4, but is different from the method for manufacturing the vibration element 4 of FIG. 4 in that two grooves are formed on each of the front and back surfaces. Hereinafter, a method for manufacturing the vibration element 5 will be described with reference to the flowchart of FIG. 4 and FIGS. 8A to 8F.

In step S1, a resist film 72w is formed on the metal film 71 on the front surface 7a of the crystal substrate 7 and is exposed and developed as in the first embodiment. As shown in FIG. 8A, in the vibration arm 54, portions where the two grooves 542a and 542b are formed are openings of the resist film 72w. Similarly, in the vibration arm 53, portions where the two grooves 532a and 532b are formed are openings of the resist film 72w. Step S1 is the same as that in the first embodiment except for these points.

In step S2, a first protective film is formed on the metal film 71 on the front surface 7a of the crystal substrate 7. Step S2 is the same as that in the first embodiment except that the portions where the two grooves are formed are openings 731a and 731b of the metal mask 73 as shown in FIG. 8B.

The first dry etching step of step S3 is the same as that in the first embodiment.

Figure 8C:
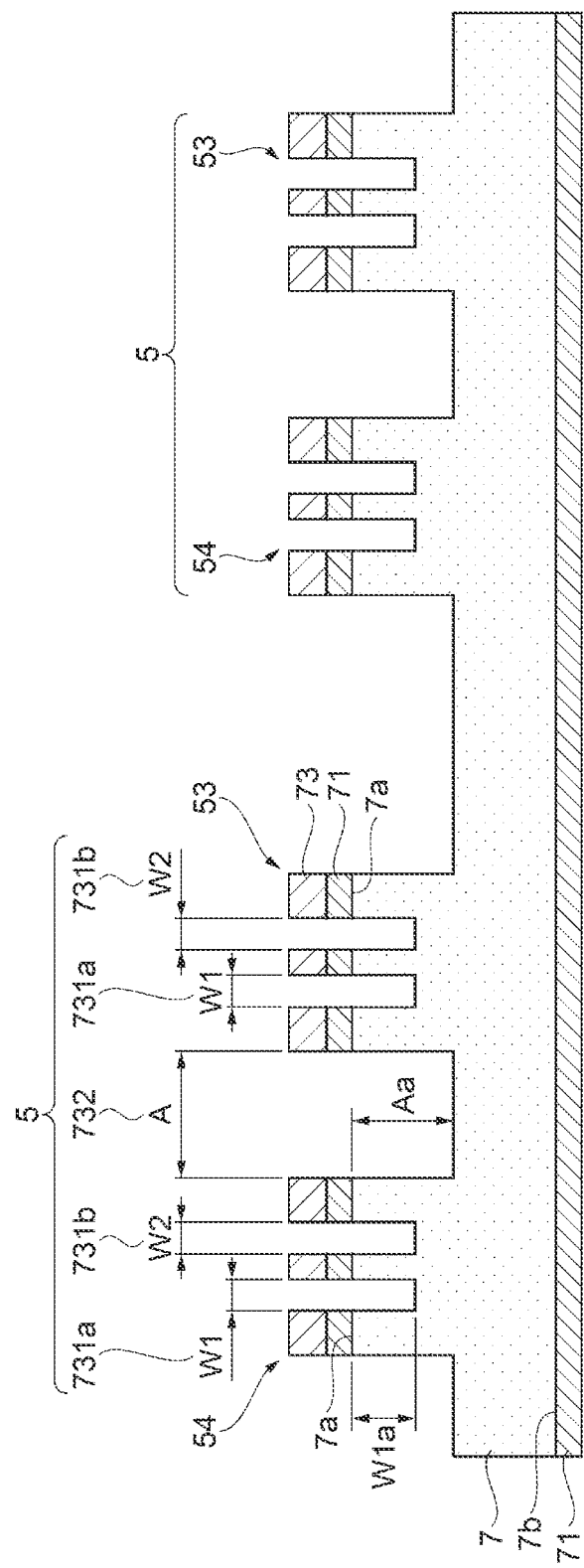
FIG. 8C is a diagram illustrating an aspect of the manufacturing step.

Here, as shown in FIG. 8C, the opening 731a is etched from the front surface 7a to a depth W1a to form the groove 542a. Similarly, the opening 731b is etched from the front surface 7a to the depth W1a to form the groove 542b. Meanwhile, the opening 732 is etched to the depth Aa that is larger than the depth W1a to form a gap of a width A between the vibration arms 53 and 54. That is, the depth W1a <the depth Aa. This is because an etching rate difference occurs due to the micro-loading effect since the width A of the opening 732 is larger than a width W1 of the opening 731a, in other words, the width W1 <the width A. The same applies to a width W2 of the opening 731b. The depth W1a is defined as a depth to the deepest portion in each region of the width W1 and the width W2, and the depth Aa is defined as a depth to the deepest portion in the region of the width A.

The metal mask 73 and the metal film 71 are removed after the completion of the first dry etching, and the back surface of the crystal substrate 7 is processed.

In step S4, a resist film 75w is formed on the metal film 71 on the back surface 7b of the crystal substrate 7 and is exposed and developed as in the first embodiment. Here, as shown in FIG. 8D, in the vibration arm 54, portions where the two grooves 543a and 543b are formed are openings of the resist film 75w. Similarly, in the vibration arm 53, portions where the two grooves 533a and 533b are formed are openings of the resist film 75w. Step S4 is the same as that in the first embodiment except for these points.

Subsequently, in step S4, a second protective film is formed on the back surface 7b of the crystal substrate 7. The metal mask 76 formed as the second protective film is the same as that in the first embodiment except that the portions where the two grooves are formed are openings 761a and 761b as shown in FIG. 8E.

The first dry etching step of step S5 is the same as that in the first embodiment.

Figure 8F:
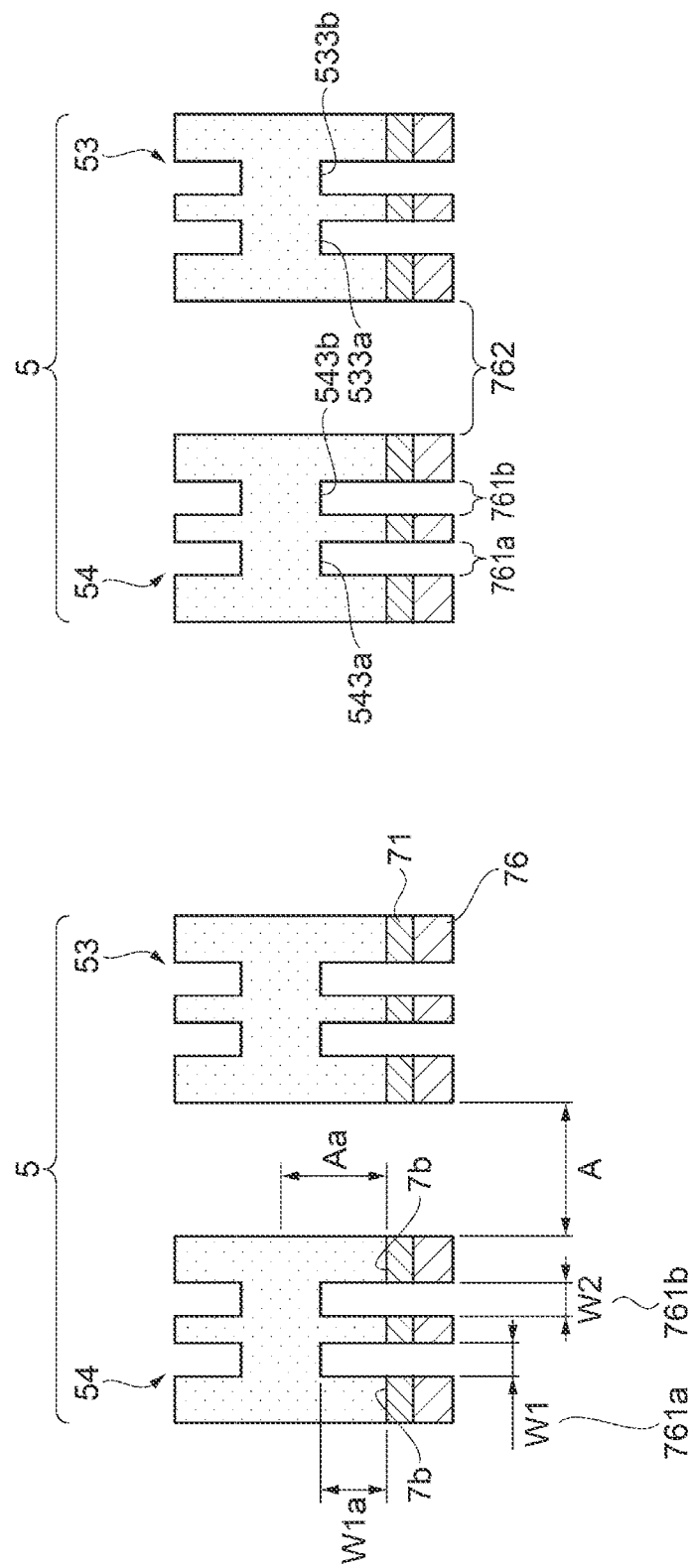
FIG. 8F is a diagram illustrating an aspect of the manufacturing step.

Here, as shown in FIG. 8F, the opening 761a is etched from the back surface 7b to the depth W1a to form the groove 543a. Similarly, the opening 761b is etched from the back surface 7b to the depth W1a to form the groove 543b. Meanwhile, the opening 762 is etched to the depth Aa that is larger than the depth W1a to form a gap of the width A between the vibration arms 53 and 54. That is, the depth W1a <the depth Aa. This is because an etching rate difference occurs due to the micro-loading effect since the width A of the opening 762 is larger than a width W1 of the opening 761a, in other words, the width W1 <the width A. The same applies to a width W2 of the opening 761b.

The opening 762 is etched to a thickness t/2 or more, which is half the thickness of the crystal substrate 7, by being etched to the depth Aa, and thus the opening 762 penetrates through the crystal substrate 7 and an outer shape is cut out. Meanwhile, the opening 761a is etched to the depth Wa, but the bottom portion 54b of the groove 543a remains, and thus the vibration arm 54 having the groove 543a is formed. The same applies to the vibration arm 53.

As described above, also in the second dry etching step, the grooves 533a and 533b, the grooves 543a and 543b, and a vibration arm outer shape including the vibration arms 53 and 54 are simultaneously formed as in the first dry etching step.

In this way, the vibration arm 53 and the vibration arm 54 are formed as shown in FIG. 7. The vibration arm 53 has the two grooves 532a and 532b on the front surface and the grooves 533a and 533b on the back surface, and the vibration arm 54 has the grooves 542a and 542b on the front surface and the grooves 543a and 543b on the back surface.

Thereafter, the metal mask 76 and the like on the surface of the vibration element 5 are removed to form the electrodes as described above, and the processing steps of the vibration element 5 are completed.

As described above, according to the vibration element 5 of the present embodiment and the manufacturing method thereof, the following effects can be obtained in addition to the effects of the first embodiment.

A plurality of grooves are formed on a main surface of one vibration arm and the groove width can be adjusted by the number of the grooves, and thus a desired groove depth can be obtained.

Further, when two grooves are formed, a groove width per groove is smaller than a groove width when one groove is formed, and thus a depth of the groove is smaller than a depth when one groove is formed by the micro-loading effect. Therefore, it is possible to increase rigidity of the vibration arms 53 and 54 by providing a plurality of grooves.

Third Embodiment

Application Example

Figure 9:
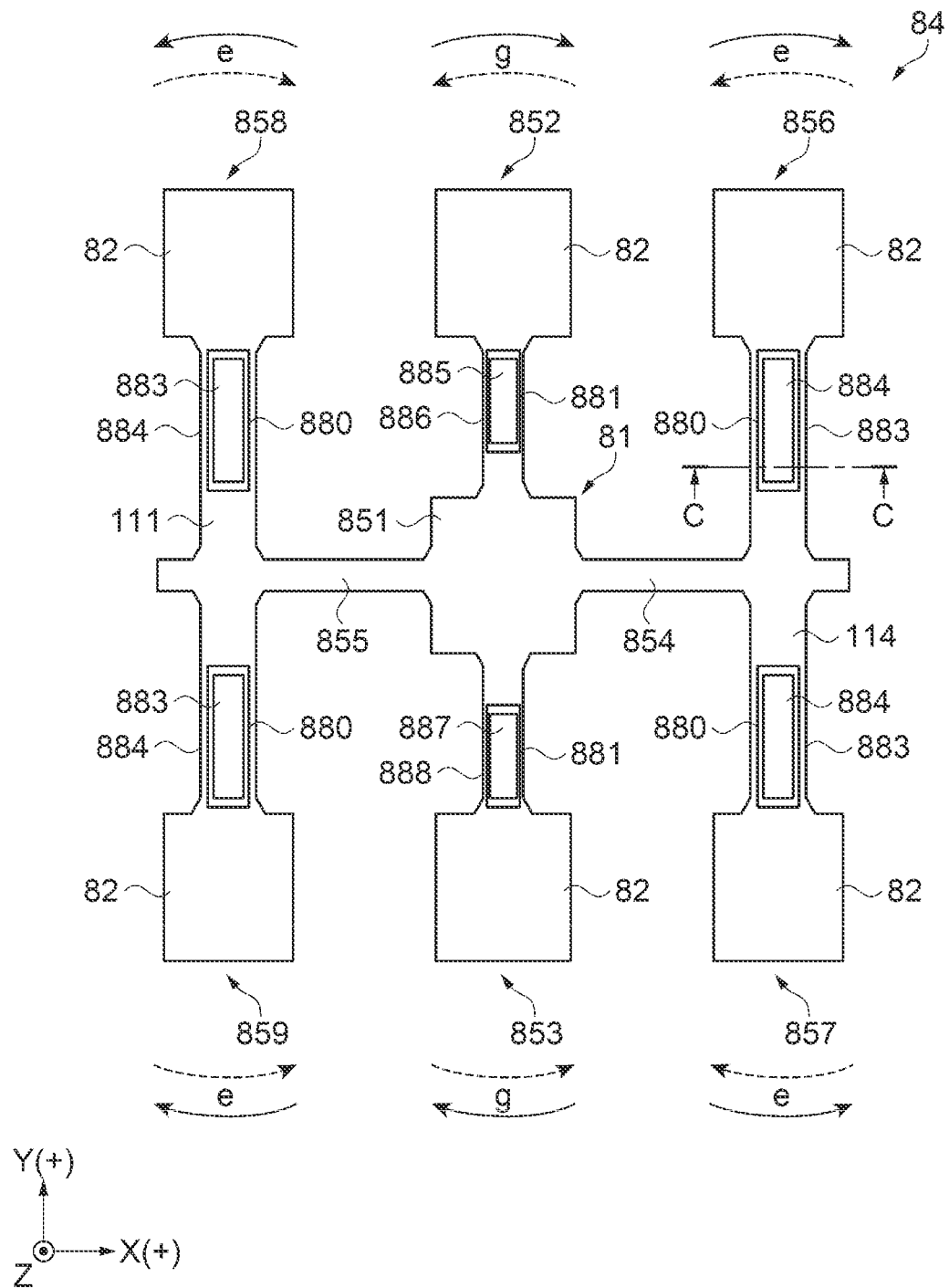
FIG. 9 is a plan view of a vibration element according to a third embodiment.

FIG. 9 is a plan view of the vibration element of the present embodiment and corresponds to FIG. 2.

In the first embodiment, it has been described that the grooves are provided in the vibration arms 43 and 44 of the tuning fork type vibration element, but the configuration and the manufacturing method of each of the present embodiments may be applied to a device having a portion corresponding to the vibration arm. Hereinafter, the same components as those in the first embodiment will be denoted by the same reference numerals, and redundant description will be omitted.

As a physical quantity sensor element, a vibration element 84 in the present embodiment is an angular velocity sensor element capable of detecting an angular velocity ωz with a Z-axis as a detection axis.

As shown in FIG. 9, the vibration element 84 includes a vibration body 81, a plurality of electrodes disposed on the vibration body 81, weights 82 as metal films for frequency adjustment, and the like.

The vibration body 81 is configured by a Z-cut crystal substrate, and includes a base portion 851 positioned at a center portion, a pair of detection arms 852 and 853 as vibration arms that extend from the base portion 851 to both sides in a Y-axis direction, a pair of connecting arms 854 and 855 that extend from the base portion 851 to both sides in an X-axis direction, a pair of drive arms 856 and 857 as vibration arms that extend from a tip end portion of the connecting arm 854 to both sides in the Y-axis direction, and a pair of drive arms 858 and 859 as vibration arms that extend from a tip end portion of the connecting arm 855 to both sides in the Y-axis direction.

In addition, the electrodes include drive signal electrodes 883, drive ground electrodes 884, first detection signal electrodes 885, first detection ground electrodes 886, second detection signal electrodes 887, and second detection ground electrodes 888.

The drive signal electrodes 883 are disposed on both side surfaces of the drive arms 856 and 857 and a front surface and a back surface of the drive arms 858 and 859. Meanwhile, the drive ground electrodes 884 are disposed on a front surface and a back surface of the drive arms 856 and 857, and both side surfaces of the drive arms 858 and 859.

Here, the drive ground electrode 884 on the front surface of the drive arm 856 is also formed on an inner surface of a groove 880 as in the first embodiment. The same applies to the drive ground electrode 884 on the back surface, and a cross section taken along a line C-C in FIG. 9 has a substantially H-shaped cross-sectional shape as in FIG. 3. The same applies to the drive arm 857. In addition, in the drive arm 858, the drive signal electrodes 883 are formed on the inner surface of the groove 880, and similarly, the cross-sectional shape is a substantially H shape. The same applies to the drive arm 859.

The first detection signal electrodes 885 are disposed on a front surface and a back surface of the detection arm 852. The first detection ground electrodes 886 are disposed on both side surfaces of the detection arm 852. Meanwhile, the second detection signal electrodes 887 are disposed on a front surface and a back surface of the detection arm 853. The second detection ground electrodes 888 are disposed on both side surfaces of the detection arm 853.

Here, the first detection ground electrodes 886 on the front surface of the detection arm 852 are also formed on an inner surface of a groove 881 as in the first embodiment. The same applies to the first detection ground electrodes 886 on the back surface, and the cross section has a substantially H-shaped cross-sectional shape as in FIG. 3. The same applies to the detection arm 853. The grooves 880 and 881 are formed by using the manufacturing method of each of the present embodiments.

In addition, weights 82 are disposed at the tip portions of the drive arms 856, 857, 858, and 859 and the detection arms 852 and 853, respectively.

The vibration element 84 as described above detects the angular velocity ωz in the following manner. First, when a drive signal is applied between the drive signal electrodes 883 and the drive ground electrodes 884, the drive arms 856 to 859 perform flexural vibration as indicated by an arrow e in FIG. 9. Hereinafter, this drive mode is referred to as a drive vibration mode. Then, a detection vibration mode is newly excited when the angular velocity ωz is applied to the vibration element 84 in a state in which the drive arms 856 to 859 are driven in the drive vibration mode. In the detection vibration mode, a Coriolis force acts on the drive arms 856 to 859 to excite a vibration in a direction indicated by an arrow f, and in response to the vibration, a detection vibration due to the flexural vibration is generated in a direction indicated by an arrow g in the detection arms 852 and 853. In such a detection vibration mode, an electric charge generated in the detection arm 852 is taken as a first detection signal from between the first detection signal electrodes 885 and the first detection ground electrodes 886, and an electric charge generated in the detection arm 853 is taken as a second detection signal from between the second detection signal electrodes 887 and the second detection ground electrodes 888. The angular velocity ωz can be detected based on the first and second detection signals.

As described above, according to the vibration element 84 of the present embodiment and the manufacturing method thereof, the following effects can be obtained in addition to the effects of the first embodiment.

The grooves 880 and 881 of the vibration element 84 are formed using the manufacturing method of each of the present embodiments. Therefore, the bottomed grooves 880 and 881 and an outer shape of the drive arms 856, 857, 858, and 859 and the detection arms 852 and 853 can be simultaneously processed by dry etching, so that the manufacturing process can be simplified and the vibration characteristics can be improved. Further, it is possible to obtain the vibration element 84 having little characteristic variation.

What is claimed is:

1. A method for manufacturing a vibration element that includes a base portion, a first vibration arm and a second vibration arm that extend from the base portion along a first direction and are arranged along a second direction intersecting the first direction, and bottomed grooves on both main surfaces of the first vibration arm and both main surfaces of the second vibration arm, the method comprising:
    a preparing step of preparing a crystal substrate on which a plurality of the vibration elements can be formed;
    a protective film forming step of forming a protective film on the crystal substrate except for groove regions, inter-arm regions, and gap regions, the groove regions being regions in which the grooves are formed, the inter-arm regions being regions between a first region in which the first vibration arm is formed and a second region in which the second vibration arm is formed, and the gap regions being regions in which gaps between adjacent vibration elements of the plurality of vibration elements are formed; and
    a dry etching step of dry etching the crystal substrate through the protective film, the dry etching step simultaneously forming the grooves and outer shapes of the vibration elements including the first vibration arm and the second vibration arm, wherein
    the grooves provided in at least one of the first vibration arm and the second vibration arm include a first groove and a second groove arranged along the second direction, and
    a distance between adjacent vibration elements among the plurality of vibration elements is larger than a width between the first vibration arm and the second vibration arm of the vibration element.

2. The method for manufacturing a vibration element according to claim 1, wherein
    the dry etching step includes a first dry etching step of simultaneously forming the grooves and the outer shapes of vibration elements on one main surface of the crystal substrate, and a second dry etching step of simultaneously forming the grooves and the outer shapes of vibration elements on another main surface of the crystal substrate.

3. The method for manufacturing a vibration element according to claim 2, wherein
    in the first dry etching step and the second dry etching step,
    $CHF_3$ is used as an etching gas.

* * * * *